United States Patent [19]
Robertson, III et al.

[11] Patent Number: 6,159,859
[45] Date of Patent: Dec. 12, 2000

[54] GAS PHASE REMOVAL OF SIO₂/METALS FROM SILICON

[75] Inventors: Eric Anthony Robertson, III, Easton, Pa.; David Arthur Bohling, Pentalume, Calif.; Mark Allen George, Wescosville; Scott Edward Beck, Kutztown, both of Pa.

[73] Assignee: Air Products and Chemicals, Inc., Allentown, Pa.

[21] Appl. No.: 09/093,975

[22] Filed: Jun. 9, 1998

[51] Int. Cl.⁷ .................................................. H01L 21/302
[52] U.S. Cl. .......................... 438/706; 720/723; 720/743
[58] Field of Search .................... 438/706, 723, 438/743, 722, 720; 252/79.1; 134/1.2, 1.3, 3, 2

[56] References Cited

U.S. PATENT DOCUMENTS

| | | | |
|---|---|---|---|
| 5,094,701 | 3/1992 | Norman et al. | 148/23 |
| 5,178,721 | 1/1993 | Sugino | 156/626 |
| 5,213,621 | 5/1993 | Ivankovits et al. | 134/3 |
| 5,221,366 | 6/1993 | Roberts et al. | 148/22 |
| 5,221,423 | 6/1993 | Sugino et al. | 156/643 |
| 5,589,422 | 12/1996 | Bhat | 437/228 |
| 5,626,775 | 5/1997 | Roberts et al. | 216/67 |

FOREIGN PATENT DOCUMENTS

| | | | |
|---|---|---|---|
| WO9257 | 7/1997 | WIPO | H01L 21/306 |

OTHER PUBLICATIONS

Kern, W., and D. Puotinen, "Cleaning Solutions Based on Hydrogen Peroxide for use in Silicon Semiconductor technology," *RCA Review*, vol. 31, p. 187 (1970).

Kern, W., "The evolution of silicon wafer cleaning technology," *J. Electrochem. Soc.*, vol. 137, No. 6, p. 1887, Jun. (1990).

Ohmi, T., M. Miyashita, M. Itano, T. Imaoka, and I. Kawanabe, *IEEE Electron Dev. Lett.*, vol. 39, No. 3, p. 537–545 (1992).

Tong, J.K., G.F. Hanger, D.S. Becker, and D.J. Syverson, "A Study of the Effectiveness of Vapor Phase Cleans for Advanced Gate Oxidations," in Electrochemical Society Proceedings vol. 95–20, p. 194 (1995).

Kuiper, A.E.T., and E.G.C. Lathouwers, "Room–Temperature HF Vapor–Phase Cleaning for Low–Pressure Chemical Vapor Deposition of epitaxial Si and SiGe Layers," *J. Electrochem. Soc.*, vol. 139, No. 9, p. 2594 (1992).

Muscat, A.J., A.S. Lawing, and H.H. Sawin, "Characterization of Silicon Oxide Etching in Gas Phase HF/Vapor Mixtures," in Electrochemical Society Proceedings vol. 95–20, p. 371 (1995).

(List continued on next page.)

*Primary Examiner*—Benjamin L. Utech
*Assistant Examiner*—Lynette T. Umez-Eronini
*Attorney, Agent, or Firm*—Geoffrey L. Chase

[57] ABSTRACT

The present invention is a process for thermal, vapor phase removal of silicon oxides and metal-containing contaminants from a surface of a substrate of a type used in manufacturing semiconductor devices comprising contacting the substrate at an elevated temperature at an elevated temperature appropriate to generate and maintain an effective amount of a cleaning reagent to form volatile by-products of the silicon oxides and the metal-containing contaminants and removing the volatile by-products from the surface, wherein the cleaning reagent is a complex of hydrogen fluoride and an oxygen-containing compound selected from the group consisting of one or more of trifluoroacetic acid, trifluoroacetic anhydride, 1,2-propanedione, a β-diketone and a β-diketoimine of the formula:

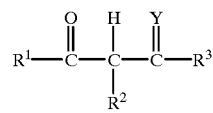

14 Claims, 2 Drawing Sheets

OTHER PUBLICATIONS

Ueda, et. al., "Vapor Phase Wafer Cleaning system; Edge 2000," *The Sumitomo Search,* No. 47, p. 134 (1991).

Mehta, J.R., T. Rogers, and Satoshi Kikuchi, "Selective Etching for Making Cylindrical Capacitors Using Anhydrous HF Vapor Phase Chemistry," in Electrochemical Society Proceedings vol. 95–20, p. 194 (1995).

Bohannon, B., B. Witowski, J. Barnett, and D. Syverson, "Vapor Phase Cleaning of Polysilicon Emitter and Titanium Silicide Structures for 0.35 Micron Technologies," in Proceedings Of The Third International Symposium On Cleaning Technology In Semiconductor Device Manufacturing (Proc. Electrochem. Soc., Pennington, NJ), p. 362 (1994).

Daffron, C., K. Torek, J. Ruzyllo, and E. Kamieniecki, "Removal of Al from Silicon Surfaces Using UV/C12," in Proceedings Of The Third International Symposium On Cleaning Technology In Semiconductor Device Manufacturing (Electrochem. Soc., Pennington, NJ), p. 281 (1994).

Sugino, Rinshi, et. al., "Removal of Fe and Al on a Silicon Surface Using UV–Excited Dry Cleaning," *IEICE Trans. Electron.,* vol. E75–C, No. 7, p. 829 (1992).

Torek, K. J. Ruzyllo, and E. Kamienicki, "Silicon Surfaces Exposed to Anhydrous HF/CH3OH Etching," in Proceedings Of The Third International Symposium On Cleaning Technology In Semiconductor Device Manufacturing (Electrochem. Soc., Pennington, NJ), p. 384 (1994).

Torek, K., A. Mieckowski, and J. Ruzyllo, "Evolution of Si Surface after Anhydrous HF:CH3OH Etching," in Electrochemical Society Proceedings vol. 95–20, p. 208 (1995).

Izumi, A, et. al., "A New Cleaning Method by Using Anydrous HF/CH3OH Vapor System," in Proceedings Of The Second International Symposium On Cleaning Technology In Semiconductor Device Manufacturing (Electrochem. Soc., Pennnington, NJ), p. 260 (1992).

Ma, Y, and M. Green, "Integrated Pre–Gate Dielectric Cleaning and Surface Preparation," in *Advances in Rapid Thermal and Integrated Processing,* F. Roozeboom (ed.), p. 217 (1996).

Garrido, B., J. Montserrt, and J.R. Morante, "The Role of Chemical Species in the Passivation of <100> Silicon Surface by HF in Water–Ethanol Solutions," *J. Electrochem. Soc.,* vol. 143, No. 12, p. 4059 (1996).

de Larios, J.M., and J.O. Borland, "Selective etching of Native Oxide Using Vapor HF Processing," in Proceedings Of The Third International Symposium On Cleaning Technology In Semiconductor Device Manufacturing (Electrochem. Soc., Pennington, NJ), p. 347 (1994).

Butterbaugh, J.W. C.F. Hiatt, and D.C. Gray, "Gas–Phase Etching of Silicon Oxide with Anhydrous HF and Isopropanol," in Proceedings Of The Third International Symposium On Cleaning Technology In Semiconductor Device Manufacturing (Proc. Electrochem. Soc., Pennington, NJ), p. 374 (1994).

E. A. Robertson III, S. E. Beck, M. A. George, D. A. Miniot, D. A. Bohling, "Chemical Vapor Cleaning of Fe and Cu from Silicon Wafer Surfaces, Paper No. MS–MoP7", AVS Nat'l Symposium, Oct. 14 1996.

S. E. Beck, M. A.George, D. A. Bohling, E. A. Robertson III, D. A. Miniot, J. L. Waskiewicz, A. J. Kobar, "The Use of $\beta$–Diketones to Remove Transition Metals", Tenth Annual Dielectrics and CVD Metallization Symposium—Schumacher, Mar. 2/3 1998, San Diego, CA.

Beck, S.E., M.A. George, D.A. Bohling, D.A. Bohling, D.A. Moniot, K.M. Young, A.A. Badowski, and E.A. Robertson, "Chemical Vapor Cleaning of Si and $SiO_2$ Surfaces," in 1996 IEEE/SEMI Advanced Semiconductor Manufacturing Conference Proceedings (IEEE, Piscataway, NJ 1996, IEEE Catalog Number 96CH35953), pp. 175–178.

Ballato, et al. "Etching Quartz Crystals in Anhydrous HF Gas" for 1996 IEEE Int'l Frequency Control Symposium.

Ruzyllo, Jerzy, "Gas–Phase Cleaning of Silicon Wafers" for Semiconductor Research Corporation Technology Transfer Course, Penn State University, May 31, 1996.

GAS PHASE REMOVAL OF SIO$_2$/METALS FROM SILICON

STATEMENT REGARDING FEDERALLY SPONSORED RESEARCH OR DEVELOPMENT

This invention was made with government supports under ONR Agreement No. N00014-94-C-0076 awarded by the Office of Naval Research. The Government has certain rights in the invention.

CROSS-REFERENCE TO RELATED APPLICATIONS

Not applicable.

BACKGROUND OF THE INVENTION

The microelectronics industry has been confronted with the problem of developing a wafer cleaning process that can better meet the needs associated with higher scales of microelectronic integration, namely contaminant-free, atomically smooth surfaces at a low cost of ownership.

In the process of fabricating a microelectronic device, such as a transistor or memory circuit, a silicon wafer undergoes many processing steps. Often, in the course of performing their function, these steps leave behind residual materials—i.e. particles, organic compounds, metals and/or metallic compounds, and low-quality SiO$_2$ layers—that must be removed before subsequent steps can be performed.

Presently, the preferred method of removing contaminants from a wafer surface is based on the original RCA clean, Kern, W., and D. Puotinen, "Cleaning Solutions Based on Hydrogen Peroxide for use in Silicon Semiconductor technology," RCA Review, vol. 31, p. 187 (1970), Kern, W., "The evolution of silicon wafer cleaning technology," J. Electrochem. Soc., vol. 137, no. 6, p. 1887, June (1990), or a modification thereof. The RCA clean is typically a 3-step process consisting of NH$_4$OH/H$_2$O$_2$/H$_2$O (standard clean 1 or SC1), HCl/H$_2$O$_2$/H$_2$O (standard clean 2 or SC2), and HF/H$_2$O. Originally the HF step was executed between the SC1 and SC2 steps, but it is now common for the HF step to occur after these steps. SC1 and SC2 leave behind a thin layer of chemically grown silicon dioxide, which is of a poorer electrical quality than thermally grown silicon dioxide. This chemical oxide may interfere with the fabrication or electrical performance of the device. Thus, the final step in the clean is a dip in 1–2% aqueous HF to remove the chemical oxide prior to further processing.

There are primarily four problems encountered with the RCA clean and its derivatives. First, these RCA cleans are liquid phase and thus are not compatible with cluster tool environments. A cluster-tool is a system which allows the wafers to move through the process sequence without being exposed to ambient air and is often run under vacuum conditions. Second, these RCA cleans cannot produce a purely contaminant-free, damage-free surface, Ohmi, T., M. Miyashita, M. Itano, I. lmaoka, and I. Kawanabe, IEEE Electron Dev. Lett., vol. 39, no. 3, p. 537–545 (1992); Tong, J. K., G. F. Hanger, D. S. Becker, and D. J. Syverson, "A Study of the Effectiveness of Vapor Phase Cleans for Advanced Gate Oxidations," in Electrochemical Society Proceedings Volume 95-20, p. 194 (1995). The HF/H$_2$O dip removes the chemical oxide formed in the SC1 and SC2 steps. However, the aqueous HF can introduce atomic metal contaminants because of the difficulty in obtaining aqueous HF at the purity needed for VLSI applications. Furthermore, the clean is conducted in ambient air which leaves a thin layer of native oxide on the surface of the freshly cleaned wafer. Third, water and chemical usage in these cleans is high, and, as a result, extreme amounts of low-level waste are produced. This adds greatly to the environmental impact of the RCA clean and its overall cost of ownership. Fourth, as features on the surface decrease in size, removing the contaminated cleaning agents by rinsing becomes an increasingly more severe issue: capillary forces may prevent complete wetting of the surface with the cleaning agent, and the low mass diffusivities in a liquid phase may make the time scale necessary for cleaning impractical.

A vapor phase oxide etch can mitigate some of the shortcomings of a liquid phase etch. Primarily, vapor phase processes are compatible with the cluster tool, eliminating the need to remove the wafer from the vacuum environment and thereby reducing contamination from air-borne contaminants, water vapor, and manual wafer handling. Compared to the traditional liquid phase cleans, gas phase cleans consume less water, thus generating less waste; have no capillary forces to prevent wetting and have much higher mass diffusivities than liquids, facilitating the removal of complexed species. Gas phase etches also have the potential to do less damage to the surface in the process of cleaning it.

However, this potential is not shared by all gas phase processes. For example, plasma processes and processes using ultraviolet (UV) light each use energetic chemistries which lead to surface damage. A reduction in surface damage can only be realized by selecting reactants that chemically target only the oxide or contaminant, leaving the silicon undamaged.

Past attempts to realize a gas phase oxide etch have focused on adapting the original RCA wet-clean formulation to a dry environment. Anhydrous HF (AHF) combined with water vapor can successfully remove SiO$_2$ in a fashion compatible with a vacuum environment, Kuiper, A. E. T., and E. G. C. Lathouwers, "Room-Temperature HF Vapor-Phase Cleaning for Low-Pressure Chemical Vapor Deposition of epitaxial Si and SiGe Layers," J. Electrochem. Soc., vol. 139, no. 9, p 2594 (1992); Muscat, A. J., A. S. Lawing, and H. H. Sawin, "Characterization of Silicon Oxide Etching in Gas Phase HF/Vapor Mixtures," in Electrochemical Society Proceedings Volume 95-20, p. 371 (1995). However, it has no capacity for removing metallic species. Thus the AHF/H$_2$O treatment is followed by either an in-situ DI water and dry step Ueda, et. al., "Vapor Phase Wafer Cleaning system; Edge 2000," The Sumitomo Search, no. 47, p. 134 (1991); Mehta, J. R., T. Rogers, and Satoshi Kikuchi, "Selective Etching for Making Cylindrical Capacitors Using Anhydrous HF Vapor Phase Chemistry," in Electrochemical Society Proceedings Volume 95-20, p. 194 (1995); Bhat, U.S. Pat. No. 5,589,422 (1996); Bohannon, B., B. Witowski, J. Barnett, and D. Syverson, "Vapor Phase Cleaning of Polysilicon Emitter and Titanium Silicide Structures for 0.35 Micron Technologies," in Proceedings Of The Third International Symposium On Cleaning Technology In Semiconductor Device Manufacturing (Proc. Electrochem. Soc., Pennington, N.J.), p. 362 (1994) or a treatment with UV light and either Cl$_2$, Daffron, C., K. Torek, J. Ruzyllo, and E. Kamieniecki, "Removal of Al from Silicon Surfaces Using UV/Cl2, " in Proceedings Of The Third International Symposium On Cleaning Technology In Semiconductor Device Manufacturing (Electrochem. Soc., Pennington, N.J.), p. 281 (1994) or SiCl$_4$ Sugino, Rinshi, et. al., "Removal of Fe and Al on a Silicon Surface Using UV-Excited Dry Cleaning," IEICE Trans. Electron., vol. E75-C, no. 7, p. 829 (1992); Sugino, U.S. Pat. No. 5,178,721 (1993); Sugino and Ito, U.S. Pat. No. 5,221,423 (1993)) to remove the metal species.

The DI water rinse/dry is not fully vacuum compatible because of the introduction of appreciable amounts of liquid water into the chamber.

The UV/$Cl_2$ treatment creates active chlorine species which react with the silicon surface leading to surface roughness at an atomic scale.

The UV/$SiCl_4$ treatment has a similar effect where the $SiCl_4$ is activated in a process which is poorly understood, leading to similar damage of the silicon surface. This damage degrades the electrical performance of the device or imposes limitations on the scale of the device.

One permutation of this approach to a fully integrated oxide etch is the substitution of an alcohol for the water. To date, only the use of short-chain aliphatic alcohols has been reported in the literature: methanol, Torek, K. J. Ruzyllo, and E. Kamieniecki, "Silicon Surfaces Exposed to Anhydrous HF/CH3OH Etching," in *Proceedings Of The Third International Symposium On Cleaning Technology In Semiconductor Device Manufacturing* (Electrochem. Soc., Pennington, N.J.), p. 384 (1994); Torek, K., A. Mieckowski, and J. Ruzyllo, "Evolution of Si Surface after Anhydrous HF:CH3OH Etching," in *Electrochemical Society Proceedings Volume* 95-20, p. 208 (1995); Izumi, A, et. al., "A New Cleaning Method by Using Anhydrous HF/CH3OH Vapor System," in *Proceedings Of The Second International Symposium On Cleaning Technology In Semiconductor Device Manufacturing* (Electrochem. Soc., Pennington, N.J.), p. 260 (1992); Ma, Y, and M. Green, "Integrated Pre-Gate Dielectric Cleaning and Surface Preparation," in *Advances in Rapid Thermal and Integrated Processing*, F. Roozeboom (ed.), p. 217 (1996), ethanol, Garrido, B., J. Montserrat, and J. R. Morante, "The Role of Chemical Species in the Passivation of <100> Silicon Surface by HF in Water-Ethanol Solutions," *J. Electrochem. Soc.*, vol. 143, no. 12, p. 4059 (1996), and propanol, de Larios, J. M., and J. O. Borland, "Selective etching of Native Oxide Using Vapor HF Processing," in *Proceedings Of The Third International Symposium On Cleaning Technology In Semiconductor Device Manufacturing* (Electrochem. Soc., Pennington, N.J.), p.347 (1994); Butterbaugh, J. W. C. F. Hiatt, and D. C. Gray, "Gas-Phase Etching of Silicon Oxide with Anhydrous HF and Isopropanol," in *Proceedings Of The Third International Symposium On Cleaning Technology In Semiconductor Device Manufacturing* (Proc. Electrochem. Soc., Pennington, N.J.), p. 374 (1994).

Presumably, the alcohol behaves in a fashion mechanistically similar to $H_2O$ with respect to the functionality of the —OH group, Muscat, A. J., A. S. Lawing, and H. H. Sawin, "Characterization of Silicon Oxide Etching in Gas Phase HF/Vapor Mixtures," in *Electrochemical Society Proceedings Volume* 95-20, p. 371 (1995); Izumi (1992); Ma (1996)) to polarize the Si—O bonds. The advantage is that the alcohols have a higher vapor pressure than water, thus aiding the removal of residual alcohol from the wafer and chamber prior to the next step of processing. The disadvantage is that the alcohol also has no more capacity to remove metal species than does $H_2O$, and thus the wafer must be further cleaned either by UV/$Cl_2$ or a liquid phase DI water rinse/dry.

U.S. Pat. No. 5,094,701 discloses a metal-containing contaminant cleaning process for silicon wafers using β-diketones or β-diketoimines in an oxidizing atmosphere of oxygen, air, HCl, $Br_2$, $Cl_2$, and HF in a carrier gas of argon, nitrogen, helium and perfluorocarbons. The cleaning process is conducted at 200° C. to 300° C. and the sole example is run at 205° C. Silicon oxide removal is not disclosed or contemplated.

U.S. Pat. No. 5,221,366 teaches a process for etching a metal substrate of metal surface materials using β-diketones or β-diketoimines in an oxidizing atmosphere of oxygen, air, HCl, $Br_2$, $Cl_2$, and HF in a carrier gas of argon, nitrogen, helium and perfluorocarbons. The cleaning process is conducted at 200° C. to 300° C. and the sole example is run at 240° C. Silicon oxide removal is not disclosed or contemplated.

E. A. Robertson III, S. E. Beck, M. A. George, D. A. Miniot, D. A. Bohling, "Chemical Vapor Cleaning of Fe and Cu from Silicon Wafer Surfaces, Paper No. MS-MoP7", AVS Nat'l Symposium, Oct. 14, 1996, was a presentation on etching of metals, in which HF and 1,1,1,5,5,5-hexafluoro-2,4-pentanedione (Hhfac) were used at 300° C. and 7.6 Torr on a metal contaminated silicon oxide surface. These conditions would be inappropriate for formation of active silicon oxide etch species from HF and Hfac. Similar results were reported in S. E. Beck, M. A. George, D. A. Bohling, E. A. Robertson III, D. A. Miniot, J. L. Waskiewicz, A. J. Kobar, "The Use of β-Diketones to Remove Transition Metals", Tenth Annual Dielectrics and CVD Metallization Symposium Schumacher, Mar. 2/3, 1998, San Diego, Calif.

U.S. Pat. No. 5,626,775 describes a plasma-based etch process of silicon oxide and other substrates from silicon wafers and other substrates using trifluoroacetic acid, trifluoroacetic anhydride, trifluoroacetic acid amide, and trifluoromethyl ester of trifluoroacetic acid. The plasma conditions include temperatures of 25° C. to 500° C. and an oxygen atmosphere. The plasma conditions would destruct the trifluoroacetic reagents during the cleaning process as alluded to at the base of column 4 of the patent. Metal contaminant removal is not disclosed or contemplated.

International Patent Appln. No. WO97/257 discloses a process for a UV activated process for removing metals from a substrate surface with β-diketones and β-diketoimines.

The semiconductor industry has been confronted with the problem of simultaneous removal of silicon oxides and metal contaminants from silicon wafers and the like in a process which has less environmental impact, more effectively removes the desired materials, requires less energy input such as from UV or plasma generators and results in a cleaner resulting substrate product. The present invention overcomes the problems of the prior art and achieves the goals of the semiconductor industry by providing an improved thermal, vapor phase process to simultaneously remove silicon oxides and metal contaminants from substrates, such as silicon wafer surfaces, as will be set forth in greater detail below.

BRIEF SUMMARY OF THE INVENTION

The present invention is a process for thermal, vapor phase removal of silicon oxides and metal-containing contaminants from a surface of a substrate of a type used in manufacturing semiconductor devices comprising contacting the substrate with a cleaning reagent at an elevated temperature appropriate to generate an effective amount of the cleaning reagent to form volatile by-products of the silicon oxides and the metal-containing contaminants and removing the volatile by-products from the surface, wherein the cleaning reagent is a complex of hydrogen fluoride and an oxygen-containing compound selected from the group consisting of one or more of trifluoroacetic acid, trifluoroacetic anhydride, 1,2-propanedione, a β-diketone or a β-diketoimine of the formula:

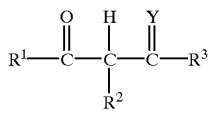

wherein $R^1$ and $R^3$ are independently selected from a linear or branched non-fluorinated, partially-fluorinated or fully fluorinated alkyl, alkenyl or aryl group having from 1 to 8 carbon atoms; $R^2$ is a hydrogen atom, a fluorine atom or a linear or branched non-fluorinated, partially fluorinated or fully fluorinated alkyl or alkenyl group having from 1 to about 8 carbon atoms, Y is selected from an oxygen atom, N-$R^4$ where $R^4$ is selected from a non-fluorinated, partially fluorinated, or fully fluorinated alkyl, aryl, aralkyl or hydroxyalkyl group having from 1 to 10 carbon atoms, or Y has the formula:

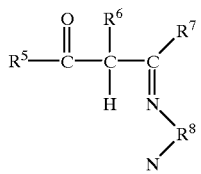

where $R^5$, $R^6$, and $R^7$ are independently selected from a hydrogen atom, a fluorine atom or a linear or branched non-fluorinated, partially fluorinated or fully fluorinated alkyl or alkenyl group having from 1 to about 8 carbon atoms, and $R^8$ is a linear or branched non-fluorinated, partially fluorinated or fully fluorinated alkylene, alkenylene, phenylene, alkylphenylene or hydroxyalkylene group having from 1 to about 8 carbon atoms.

Preferably, the oxygen-containing compound is 2,2,6,6-tetramethyl-3,5-heptanedione.

Preferably, the silicon oxides is silicon dioxide.

Preferably, the temperature is in the range of greater than 25° C. to less than 300° C.

More preferably, the temperature is in the range of greater than 50° C. to less than 125° C.

Preferably, the hydrogen fluoride is anhydrous hydrogen fluoride.

Preferably, the contacting is performed at a pressure in the range of approximately 100 mTorr to 760 Torr.

More preferably, the contacting is performed at a pressure in the range of approximately 100 to 200 Torr.

Further, the present invention is a process for thermal, vapor phase removal of silicon dioxide and metal-containing contaminants from a surface of a silicon wafer comprising contacting the silicon wafer at a temperature in the range of greater than 50° C. and less than 125° C. with an effective amount of a cleaning reagent to form volatile by-products of the silicon dioxide and the metal-containing contaminants and removing the volatile by-products from the surface, wherein the cleaning reagent is a complex of anhydrous hydrogen fluoride and a β-diketone of the formula:

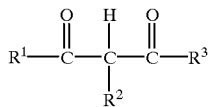

wherein $R^1$ and $R^3$ are independently selected from a linear or branched non-fluorinated, partially-fluorinated or fully fluorinated alkyl, alkenyl or aryl group having from 1 to 8 carbon atoms; $R^2$ is a hydrogen atom, a fluorine atom or a linear or branched non-fluorinated, partially fluorinated or fully fluorinated alkyl or alkenyl group having from 1 to about 8 carbon atoms.

Preferably, the cleaning reagent includes an inert carrier gas.

More preferably, the inert carrier gas is selected from the group consisting of nitrogen, helium, argon and mixtures thereof.

Preferably, the cleaning reagent includes an oxidant.

More preferably, the oxidant is selected from the group consisting of air, nitrous oxide, oxygen, and mixtures thereof.

Optimally, the present invention is a process for thermal, vapor phase removal of silicon dioxide and metal-containing contaminants from a surface of a silicon wafer comprising contacting the silicon wafer at a temperature in the range of greater than 50° C. and less than 125° C. and a pressure of approximately 100 to 200 Torr with an effective amount of a cleaning reagent to form volatile by-products of the silicon dioxide and the metal-containing contaminants and removing the volatile by-products from the surface, wherein the cleaning reagent is a complex of anhydrous hydrogen fluoride and 2,2,6,6-tetramethyl-3,5-heptanedione in a nitrogen carrier gas.

DETAILED DESCRIPTION OF THE INVENTION

Figure 1:
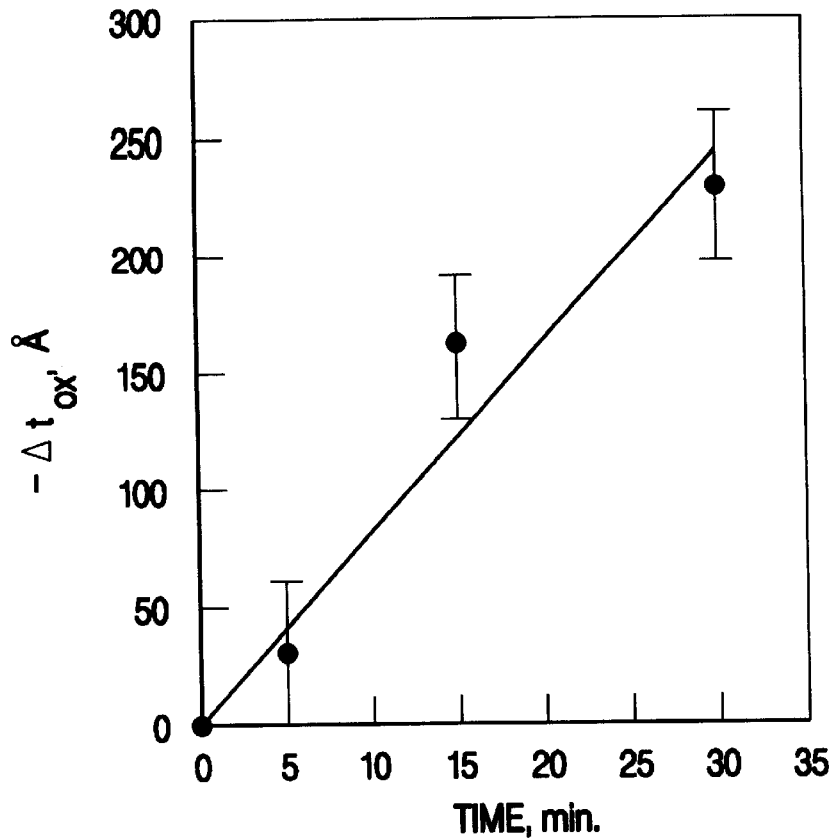
FIG. 1 is a graph of etch rate of the present invention versus time (min.) where etch rate is Delta $t_{ox}$, Å, where Delta $t_{ox}$ is −8.2 t and the error bars are ±1σ.

The microelectronics industry has long considered the removal of native and chemically grown silicon oxides and metallic contaminant removal important. Currently, the silicon oxide removal and metal atom removal are effected in separate steps. Methods for removing oxide in a vapor phase process have used either an anhydrous hydrogen fluoride (AHF)/$H_2O$ chemistry or a similar AHF/alcohol chemistry. AHF/$H_2O$ and AHF/alcohol etches can remove the unwanted silicon oxide layers due to their interaction together, but they can not remove any possible metal contamination. Thus, there is a need for a second step to remove metals.

The approach described in the present invention preferably introduces a β-diketone, a β-diketoimine or similarly chemically active oxygen containing compound, along with anhydrous hydrogen fluoride in place of the water vapor or alcohol to remove the silicon oxide and to chelate any metallic contamination present on the surface. The chelated metal then desorbs from the surface.

The oxygen-containing compounds of the present invention which are used in conjunction with AHF are selected from one or more of trifluoroacetic acid, trifluoroacetic anhydride, 1,2-propanedione, a β-diketone or a β-diketoimine of the formula:

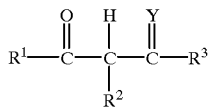

wherein $R^1$ and $R^3$ are independently selected from a linear or branched non-fluorinated, partially-fluorinated or fully fluorinated alkyl, alkenyl or aryl group having from 1 to 8 carbon atoms; $R^2$ is a hydrogen atom, a fluorine atom or a linear or branched non-fluorinated, partially fluorinated or fully fluorinated alkyl or alkenyl group having from 1 to about 8 carbon atoms, Y is selected from an oxygen atom, N-$R^4$ where $R^4$ is selected from a non-fluorinated, partially fluorinated, or fully fluorinated alkyl, aryl, aralkyl or hydroxyalkyl group having from 1 to 10 carbon atoms, or Y has the formula:

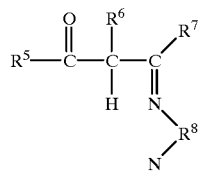

where $R^5$, $R^6$, and $R^7$ are independently selected from a hydrogen atom, a fluorine atom or a linear or branched non-fluorinated, partially fluorinated or fully fluorinated alkyl or alkenyl group having from 1 to about 8 carbon atoms, and $R^8$ is a linear or branched non-fluorinated, partially fluorinated or fully fluorinated alkylene, alkenylene, phenylene, alkylphenylene or hydroxyalkylene group having from 1 to about 8 carbon atoms.

In a preferred embodiment, 2,2,6,6-tetramethyl-3,5-heptanedione (THD) and AHF meet both the need to remove silicon oxide for fabrication purposes and the need to remove metal contamination for sensitive process steps. Often both of these objectives are important in a processing step. The ability to accomplish both in the same step is a significant improvement in the art.

There are two issues which determine the efficiency of the removal process: access of the chelating ligand to the metal contaminant and the volatility of the resulting metal complex. 1,1,1,5,5,5-hexafluoro-2,4-pentanedione (Hhfac), one example of a β-diketone, has been shown to provide sufficient volatility to remove both iron and copper from silicon surfaces in a gas phase process. However, limits were reached below which further removal was not possible in a useful period of time, presumably because the metal species were trapped in a thin layer of native or chemical oxide formed during the same processes that contaminated the surface. Therefore, removing the oxide to provide access to the metal atoms is thought to be important in removing residual metal contamination.

A process that addresses both volatility and access issues simultaneously would have a distinct advantage over processes that cannot. The combination of THD and AHF at appropriate temperatures sufficient to generate an effective amount of a cleaning reagent complex of the two components has been surprisingly shown in the present invention to both remove silicon dioxide and to remove copper, iron, nickel, and zinc from contaminated surfaces.

Although not wanting to be held to any specific theory of why the combination of THD or other or similarly chemically active oxygen containing compound used in conjunction with AHF successfully removes silicon oxides, as well as metals, the present inventors believe that THD and AHF, for instance, at appropriate elevated temperatures form a complex which makes available an $HF_2^-$ radical which reacts, in turn, with silicon oxides, such as silicon dioxide. A silicon fluoride by-product is formed which volatilizes from the surface being treated. As silicon oxides are removed, metal contaminants become exposed which are then subject to the ligand action of the THD or similarly chemically active oxygen containing compound. In this manner, the unique combination of THD, AHF and appropriate elevated temperatures for the complex between them to form provides for the unique performance result of etching silicon oxides while at the same time scavenging metal contaminants, each resulting in a volatile by-product which is easily removed from the surface that is being treated.

A depiction of the theorized complex which actively reacts with silicon oxides, at appropriate elevated temperatures where the complex is stable, is set forth below, where the HF is coordinated through its hydrogen to the oxygens of the β-diketone, resulting in a negatively charged fluorine, which can attack the silicon oxides much the same way $HF_2^-$ is theorized to react with silicon dioxide.

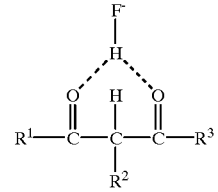

Figure 2:
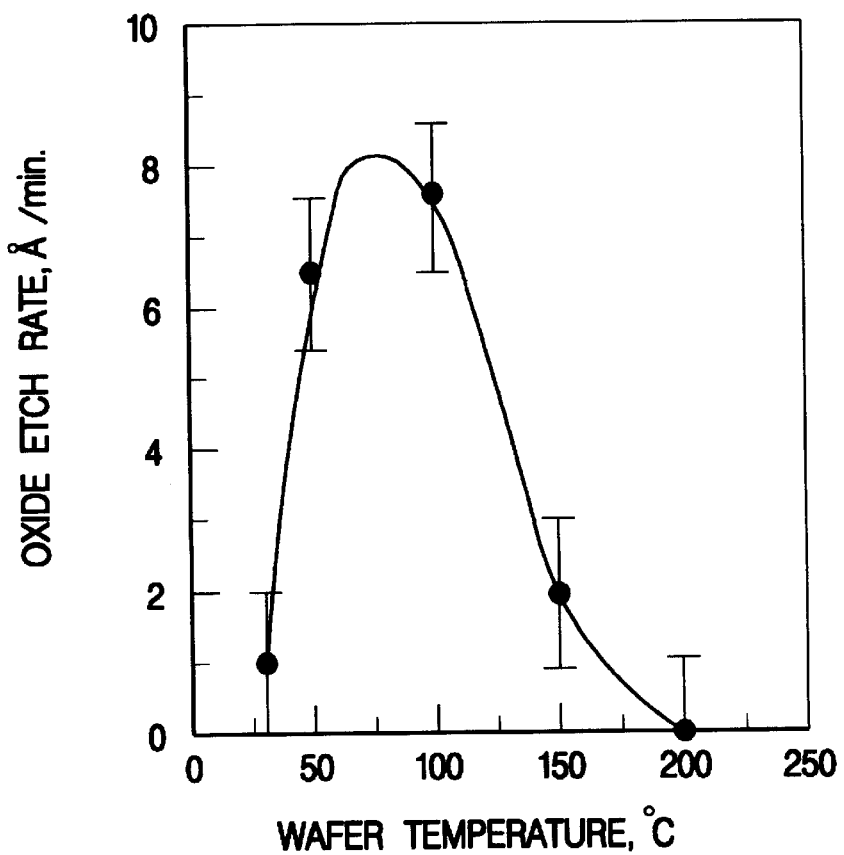
FIG. 2 is a graph of oxide etch rate of the present invention versus wafer temperature (° C.) where the oxide etch rate is Å/min. and the error bars are ±1σ.

Temperature criticality for the creation and maintenance of the cleaning reagent complex to achieve silicon oxide etch is illustrated in FIG. 2, which is discussed in greater detail below.

It may be useful to combine several different chemical and physical processes to optimize the effect. Possible variations include (1) increasing the temperature and/or lower the total pressure after the AHF/THD exposure to increase the rate of desorption of metal-THD complexes on the surface, (2) following the THD/HF process with Hhfac or other fluorinated beta-diketones to substitute Hhfac for THD in the metal-THD complex and provide greater volatility, (3) executing the exposure at higher temperatures and lower pressures which are more favorable for desorption, thus striking a balance between oxide removal and metal-complex desorption, and (4) using an even lower volatility β-diketone, such as; 2,2-dimethyl-6,6,7,7,8,8,8-heptafluoro-3,5-octanedione (Hhfod) to increase the temperature at which effective oxide removal continues, while retaining metal chelation capability and formation of volatile metal products.

In a preferred embodiment, the present invention is a process for the removal of silicon dioxide and/or metal contaminants from a silicon wafer using a vapor phase mixture of 2,2,6,6-tetramethyl-3,5-heptanedione (THD) and anhydrous hydrogen fluoride (AHF). The process is applied by exposing the silicon wafer surface to a mixture of THD, AHF and an inert carrier gas, e.g. dry nitrogen at an appropriate elevated temperature to generate and maintain the cleaning reagent complex, e.g. greater than 25 to less than 200° C. The normal boiling point of THD is approximately 220° C., and thus is in a liquid state at room temperature and atmospheric pressure, i.e. THD is much less volatile than water. The THD is first injected in its liquid state into a heated vaporization chamber by direct liquid injection. A mixture of AHF and nitrogen purges the vaporization chamber, carrying all three components to the reactor, at which point they contact the wafer. After a predetermined exposure time has elapsed, the wafer is removed from the reactor or passed onto the next step of processing in a cluster tool. Unreacted THD is thermally cracked in a downstream furnace producing $CO_2$ and $H_2O$; the AHF is neutralized in a downstream Sodasorb column and aqueous KOH bubbler.

The process was developed using dry thermal silicon dioxide grown on <111> p-type silicon wafers. The gases used were anhydrous HF, and pure dry $N_2$. The THD was supplied by direct liquid injection into a vaporizer and then carried into the reaction chamber with the $AHF/N_2$ mixture.

Proposed equivalents include; substitutes for the type of silicon oxide, e.g. wet thermal silicon oxide, TEOS-derived silicon oxide, borophosphate silicate glass (BPSG) or any other type of silicon dioxide; various β-diketones, β-diketoimines and similar chemically acting oxygen-containing compounds, including, but not limited to, 1,1,1,5,5,5-hexafluoro-2,4-pentanedione (Hhfac), acetyl acetone, 1,2-propanedione, trifluoroacetic acid and trifluoroacetic anhydride, and 2,2-dimethyl-6,6,7,7,8,8,8-heptafluoro-3,5-octanedione (Hhfod), 4-(2,2,2-trifluoroethyl)-imino-1,1,1,5,5,5-hexafluoro-2-pentanone, 5-(2,2,2-trifluoroethyl)imino-1,1,1,2,2,6,6,6-octafluoro-3-hexanone, 6-(2,2,2-trifluoroethyl)imino-1,1,1,2,2,3,3,7,7,7-decafluoro-4-heptanone, 4-(phenyl)imino-1,1,1,5,5,5-hexafluoro-2-pentanone, 4-(2-hydroxyethyl)imino-1,1,1,5,5,5-hexfluoro-2-pentanone, 1,2-di(4-imino-1,1,1,5,5,5-hexafluoro-2-pentanone)ethane, 1,2-di-(5-imino-1,1,1,2,2,6,6,6-octafluoro-3-hexanone)ethane, 1,2-di(6-imino-1,1,1,2,2,3,3,7,7,7-decafluoro-4-heptanone)ethane, bis[4(methylene)imino-1,1,1,5,5,5-hexafluoro-2-pentanone]methane, bis[4(methylene)imino-1,1,1,5,5,5-hexafluoro-2-pentanone] methanol; and other carrier gases, such as helium, argon, etc. Air, nitrous oxide or another oxidant may be introduced during the oxide strip to oxidize any metal contaminants during the process, making them more susceptible to chelation and eventual removal.

The preferred operating conditions for the process encompass wafer surface temperature, total pressure, and flow rates for the carrier gas and reactants. The wafer surface temperature can be varied between greater than 25° C. to less than 300° C., but no greater than an elevated temperature effective for the cleaning to etch silicon oxide, and is preferably controlled using a proportional with integral and derivative (PID) controller. The total pressure can be varied between 100 Torr or 200 Torr and may be controlled manually using a throttle valve on the outlet of the reactor. The flow rates can be varied between 0 and 0.2 ml/min for THD and 0 and 50 sccm for AHF. The nitrogen flow rate can be adjusted to provide a constant total molar flow of 376 sccm or 0.015 gmol/min. The particular reactor volume used in the experiments was 5.082 liters, producing a space time of between 2 and 3 minutes, depending on the average temperature of the mixture in the reactor.

The THD can be introduced by direct liquid injection using a calibrated syringe pump and a 5' PEEK capillary tubing with inside diameter of 0.010". The AHF can be delivered from a cylinder, under its own vapor pressure, using a calibrated STEC mass flow controller compatible with anhydrous HF service. UPC nitrogen can be delivered by mass flow controller from a typical cylinder at a pressure of 40 psig.

The limits and ranges described above are simply those used in the experiments. The overall limits are set by the properties of the β-diketones, β-diketoimines or other similar chemically acting oxygen-containing compounds. THD must be in a liquid state to be injected into the reaction chamber. Thus the normal freezing point is a practical lower limit on the injection temperature (approximately 5° C.). The upper limit for injection corresponds to the decomposition temperature, or about 400° C. These values are approximate because the physical properties of THD, β-diketones and β-diketoimines in general, are not well known.

Limits on pressure arise from the practicalities of the vacuum environment for which this process is envisioned, i.e. 100 mTorr to 760 Torr.

EXAMPLE 1

All metal components exposed to anhydrous HF were fluorine passivated prior to being placed into service. The reactor was constructed of stainless steel and was coated with a gold layer approximately 50 μm thick to prevent the reactive components of the chemistry from attacking the surface of the reactor. The following are the specific steps used in the process developed for the laboratory.

1. The vaporizer was heated to 170° C. and the abatement furnace to 750° C.

2. A silicon sample was inserted into the reaction chamber.

3. The reaction chamber was cycle purged with dry nitrogen three times between 10 Torr and 300 Torr.

4. If the wafer is to be run at an elevated temperature, a set point is entered for the heating elements which is appropriate for the desired wafer surface temperature.

5. Gas flow of AHF, THD, and nitrogen was initiated.

6. Pressure was controlled to the desired level by manually adjusting throttle valve.

7. When time of exposure had expired, the flow of THD and AHF was ended, but the nitrogen was kept flowing to purge the reactor of residual THD and AHF.

8. Set points to heating elements were reduced to <100° C.

9. The system was cycle purged 10 times between 10 Torr and 300 Torr using nitrogen and synthetic air. The purpose of the air is to help speed the process of repressurizing the chamber so that the sample can be removed. It plays no role in the chemistry of the process.

10. When wafer or wafer piece had cooled to a manageable temperature (typically ~150° C.) the throttle valve was closed and the chamber raised to atmospheric pressure, keeping the dry nitrogen purge flowing.

11. The sample was extracted from the chamber.

12. Step (2) was continued if further wafers are to be run.

13. The chamber was closed and left under vacuum with 100 mTorr of purge nitrogen flowing.

14. The vaporizer, wafer heating elements, and abatement furnace were turned off.

It has been demonstrated that the process of the present invention can both remove silicon oxides at a rate useful for a vapor phase clean and can remove copper, nickel, iron and zinc from a surface, such as a silicon wafer having a silicon oxide layer. Silicon oxide removal is reported in terms of the time rate change of thickness of bulk silicon oxide. The maximum measured silicon oxide removal rate was 8 Å/min for thermally-grown dry silicon oxide at reaction conditions of 200 Torr total pressure and 100° C. wafer surface temperature. The silicon oxide etch rate was constant in time over the ranges studied. The rate was determined by measuring the difference in oxide thickness before and after a timed exposure to the THD/HF mixture. Silicon oxide thicknesses were measured using ellipsometry.

Figure 3:
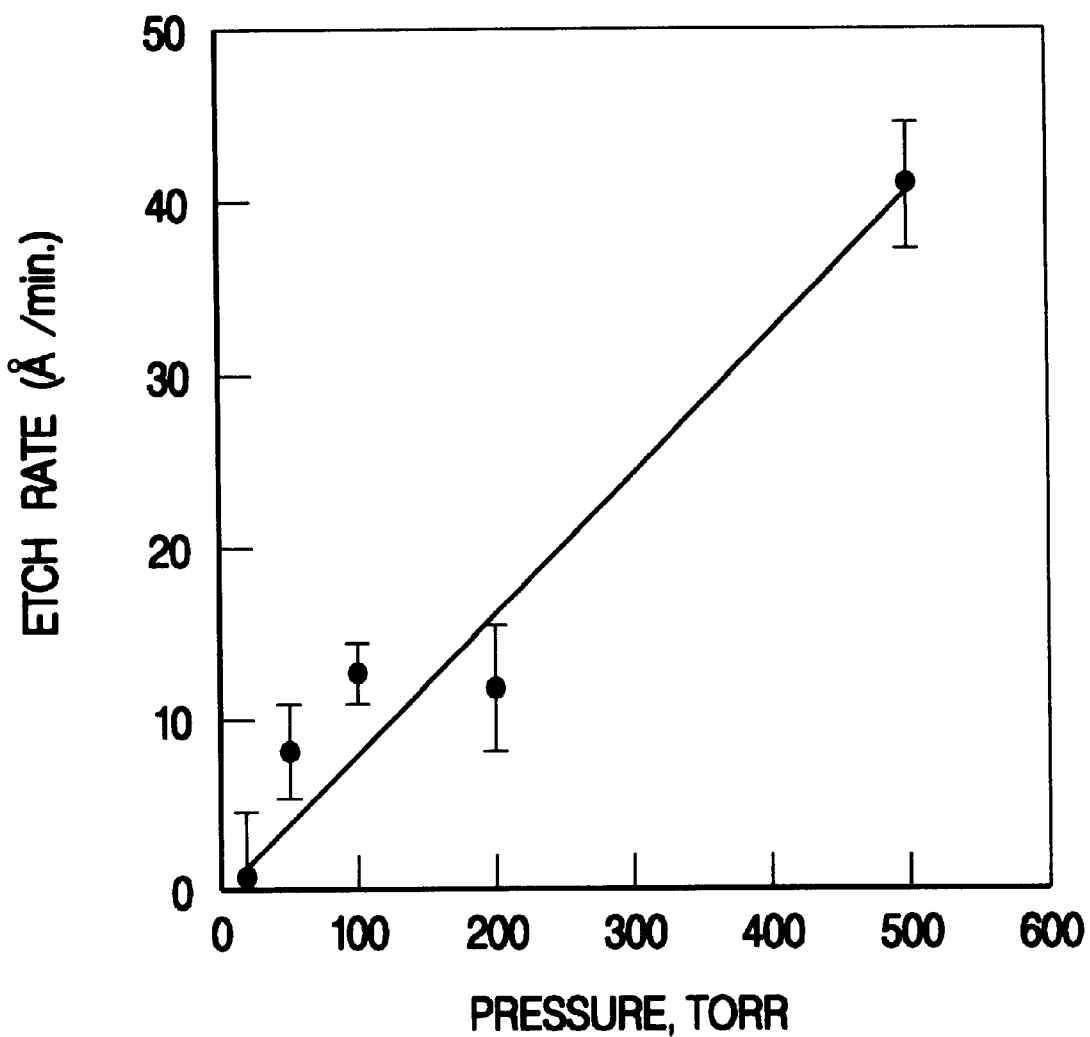
FIG. 3 is a graph of etch rate of the present invention versus pressure in Torr where the etch rate is Å/min. and the error bars are ±1σ.

FIGS. 1, 2 and 3 show typical results for the removal of thermal oxide grown on <100> silicon wafers using dry $O_2$. FIG. 1 demonstrates that the removal rate is constant over the duration of the experiments performed, up to 30 minutes. FIG. 2 dramatically shows the unexpected effect of temperature on the silicon oxide etch rate using THD/AHD. Above 100° C., as the temperature increases, the removal rate decreases. At 200° C., the removal rate is no longer measurable by ellipsometry. FIG. 3 shows the effect of reactor pressure on the oxide etch rate for oxide grown under dry oxidation conditions. The effectiveness of the oxide removal tended to increase with the pressure over the range studied.

EXAMPLE 2

The removal of copper, iron, nickel, and zinc, as well as silicon oxide, from a silicon wafer surface was also demonstrated. A silicon wafer was thermally oxidized in the presence of HCl and intentionally contaminated with metal using electron-beam evaporation of a source material. Samples of the wafer were then exposed to the AHF/THD mixture at a total pressure of 200 Torr, delivery rates of 50 sccm HF and 0.2 ml/min of THD, and several different wafer temperatures (100, 200, and 300° C.). Copper and iron removal was observed at all temperatures studied, while nickel and zinc removal was observed only at elevated temperatures. Metal removal was demonstrated using x-ray photoelectron spectroscopy (XPS) and secondary ion mass spectroscopy (SIMS). After exposure, concentrations of iron, nickel and zinc were below the detection limit for XPS, whereas the control sample showed a significant signal from these metals. The surface concentrations were also measured by SIMS; that data are shown below in Table I. The precision of SIMS measurements is approximately 30%. Therefore the apparent increase in zinc and nickel concentration between the control sample and the 100° C. condition is not significant and suggests that removal is not effective at 100° C. The same trend in silicon oxide etch rate was observed as before: above 100° C. the rate decreased as the temperature increased, with no oxide etch above 200° C.

TABLE 1

Final Surface Metal Concentrations after Treatment with AHF/THD
(The experimental error in the data is approximately 30%.)

| Condition | Cu atoms/cm$^2$ | Fe atoms/cm$^2$ | Ni atoms/cm$^2$ | Zn atoms/cm$^2$ |
|---|---|---|---|---|
| Control | 1.87E + 12 | 3.77E + 14 | 1.21E + 13 | 7.92E + 13 |
| 100° C. | 2.98E + 11 | 1.27E + 14 | 1.58E + 13 | 1.07E + 14 |
| 200° C. | 2.11E + 11 | 1.14E + 12 | 2.42E + 13 | 3.03E + 13 |
| 300° C. | 2.29E + 11 | 2.11E + 11 | 2.81E + 12 | 3.27E + 12 |

When the wafers were exposed to just one of the components, either THD or AHF, no bulk oxide removal was observed, as set forth in the following example.

EXAMPLE 3

Experiments were conducted on silicon wafers on which oxide layers were intentionally prepared to compare the effect of: (1) no reagent; (2) THD alone; (3) AHF alone; and (4) the present invention's combination of THD and AHF. The series of experiments were conducted at temperatures of 50 to 100° C., with exposure times of 3 to 6 minutes at partial pressures of reagent of 0 to 16.7 Torr. Measurements of change in oxide thickness were made after contact with the reagent. The uncertainty in the thickness measurement was between 5 Å and 10 Å. A positive "Change in Thickness" indicates that the measured thickness after the exposure was greater than before the exposure; for these results, a thickness change less than 10 Å indicates no measurable oxide removal was observed. All of the experiments were conducted at a total pressure of 100 Torr, using dry $N_2$ gas as the inert carrier. Based on this data reported in Table 2, AHF or THD alone does not have the capacity for bulk removal of oxide.

TABLE 2

| Wafer Temp ° C. | THD Partial Pressure Torr | HF Partial Pressure Torr | Exposure Time min | Change in Thickness Å |
|---|---|---|---|---|
| Control (no THD; no HF) | | | | |
| 100 | 0 | 0 | 6 | 2 |
| 50 | 0 | 0 | 6 | 2 |
| 50 | 0 | 0 | 4 | 4 |
| THD Only | | | | |
| 50 | 4.8 | 0 | 3 | 3 |
| HF Only | | | | |
| 50 | 0 | 16.7 | 3 | −5 |
| THD and HF | | | | |
| 50 | 4.5 | 15.9 | 5 | −19 |
| 50 | 4.7 | 15.9 | 4 | −19 |
| 50 | 4.8 | 15.9 | 5 | −22 |

EXAMPLE 4

AHF was used with another β-diketone, Hhfac, at 7.6 Torr and 300° C. wafer surface temperature. Hhfac has been shown to chelate with iron and copper on a silicon surface and lower the metal contamination to levels near 1E11 atoms/cm$^2$ for iron and 1E10 atoms/cm$^2$ for copper, Beck, S. E., M. A. George, D. A. Bohling, D. A. Moniot, K. M. Young, A. A. Badowski, and E. A. Robertson, "Chemical Vapor Cleaning of Si and $SiO_2$ Surfaces," in 1996 *IEEE/SEMI Advanced Semiconductor Manufacturing Conference Proceedings* (IEEE, Piscataway, N.J., 1996, IEEE Catalog Number 96CH35953), pp. 175–178. The addition of AHF to Hhfac at 7.6 Torr and 300° C. did not improve the lower limit of metal removal compared to Hhfac alone at the same conditions. Bulk oxide removal was not attempted. Processes reported in the literature which are based on water vapor or alcohols fail to remove metal contamination without further treatment with a DI water rinse/dry step or a UV step.

The present invention has shown that the chemistry described requires the presence of the THD, β-diketone, β-diketoimine or similar chemically acting oxygen-containing compound and the AHF simultaneously.

The present invention has been shown to overcome the problems of the prior art and to achieve the goals of the semiconductor industry by providing an improved thermal, vapor phase process to simultaneously remove silicon oxides and metal contaminants from substrates, such as silicon wafer surfaces, in an expeditious process, with low effluent concentration levels, and with minimal impact on the wafers being processed and cleaned. A unique aspect of the present invention as an improvement over traditional silicon wafer cleans is the ability of the present invention to clean not only surface metal contamination, but also metal contaminants incorporated in the silicon oxide layer, which can easily form on silicon wafers, because of the ability of the present invention's process to perform simultaneous metal removal and silicon oxide etch to expose the incorporated metal for metal removal by the ligand portion of the reagent.

The present invention has been set forth with regard to several preferred embodiments to exemplify the invention, but the full scope of the present invention should be ascertained from the claims which follow.

What is claimed is:

1. A process for thermal, vapor phase simultaneous removal of silicon oxides and metal-containing contaminants trapped in said oxide from a surface of a substrate of a type used in manufacturing semiconductor devices, comprising; contacting the substrate with a cleaning reagent at an elevated temperature in the range of greater than 50° C. to less than 125° C. appropriate to generate an effective amount of said cleaning reagent to form volatile by-products of said silicon oxides and said metal-containing contaminants and removing said volatile by-products from the surface, wherein said cleaning reagent is a complex of hydrogen fluoride and an oxygen-containing compound selected from the group consisting of one or more of 1,2-propanedione, a β-diketone or a β-diketoimine of the formula:

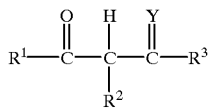

wherein $R^1$ and $R^3$ are independently selected from a linear or branched non-fluorinated, partially-fluorinated or fully fluorinated alkyl, alkenyl or aryl group having from 1 to 8 carbon atoms; $R^2$ is a hydrogen atom, a fluorine atom or a linear or branched non-fluorinated, partially fluorinated or fully fluorinated alkyl or alkenyl group having from 1 to about 8 carbon atoms, Y is selected from an oxygen atom, $N\text{-}R^4$ where $R^4$ is selected from a non-fluorinated, partially fluorinated, or fully fluorinated alkyl, aryl, aralkyl or hydroxyalkyl group having from 1 to 10 carbon atoms, or Y has the formula:

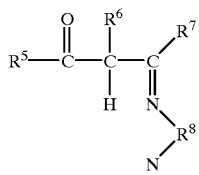

where $R^5$, $R^6$, and $R^7$ are independently selected from a hydrogen atom, a fluorine atom or a linear or branched non-fluorinated, partially fluorinated or fully fluorinated alkyl or alkenyl group having from 1 to about 8 carbon atoms, and $R^8$ is a linear or branched non-fluorinated, partially fluorinated or fully fluorinated alkylene, alkenylene, phenylene, alkylphenylene or hydroxyalkylene group having from 1 to about 8 carbon atoms.

2. The process of claim 1 wherein said oxygen-containing compound is 2,2,6,6-tetramethyl-3,5-heptanedione.

3. The process of claim 1 wherein said silicon oxides is silicon dioxide.

4. The process of claim 1 wherein said hydrogen fluoride is anhydrous hydrogen fluoride.

5. The process of claim 1 wherein said contacting is performed at a pressure in the range of approximately 100 mTorr to 760 Torr.

6. The process of claim 1 wherein said contacting is performed at a pressure in the range of approximately 100 to 200 Torr.

7. A process for thermal, vapor phase simultaneous removal of silicon dioxide and metal-containing contaminants trapped in said oxide from a surface of silicon wafer comprising contacting said silicon wafer at a temperature in the range of greater than 50° C. and less than 125° C. with an effective amount of a cleaning reagent to form volatile by-products of said silicon dioxide and said metal-containing contaminants and removing said volatile by-products from said surface, wherein said cleaning reagent is anhydrous hydrogen fluoride and said β-diketone has the formula:

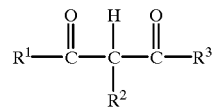

wherein $R^1$ and $R^3$ are independently selected from a linear or branched non-fluorinated, partially-fluorinated or fully fluorinated alkyl, alkenyl or aryl group having from 1 to 8 carbon atoms; $R^2$ is a hydrogen atom, a fluorine atom or a linear or branched non-fluorinated, partially fluorinated or fully fluorinated alkyl or alkenyl group having from 1 to about 8 carbon atoms.

8. The process of claim 7 wherein said β-diketone is 2,2,6,6-tetramethyl-3,5-heptanedione.

9. The process of claim 7 wherein said cleaning reagent includes an inert carrier gas.

10. The process of claim 9 wherein said inert carrier gas is selected from the group consisting of nitrogen, helium, argon and mixtures thereof.

11. The process of claim 7 wherein said cleaning reagent includes an oxidant.

12. The process of claim 11 wherein said oxidant is selected from the group consisting of air, nitrous oxide, oxygen and mixtures thereof.

13. The process of claim 7 wherein said temperature is approximately 100° C., pressure is approximately 200 Torr, and the cleaning reagent comprises anhydrous hydrogen fluoride and 2,2,6,6-tetramethyl-3,5-heptanedione in a nitrogen carrier gas.

14. A process for thermal, vapor phase simultaneous removal of silicon dioxide and metal-containing contaminants trapped in said oxide from a surface of a silicon wafer, comprising; contacting said silicon wafer at a temperature in the range of greater than 50° C. and less than 125° C. and a pressure of approximately 100 to 200 Torr with an effective amount of a cleaning reagent to form volatile by-products of said silicon dioxide and said metal-containing contaminants and removing said volatile by-products from said surface, wherein said cleaning reagent is a complex of anhydrous hydrogen fluoride and 2,2,6,6-tetramethyl-3,5-heptanedione in a nitrogen carrier gas.

* * * * *